US012766779B2

(12) United States Patent
Harkema et al.

(10) Patent No.: US 12,766,779 B2
(45) Date of Patent: Oct. 20, 2026

(54) THERMOFORMED DEVICE WITH OLED DISPLAY AND METHOD OF FABRICATION

(71) Applicant: Nederlandse Organisatie voor toegepast-natuurwetenschappelijk onderzoek TNO, 's-Gravenhage (NL)

(72) Inventors: Stephan Harkema, Hilversum (NL); Jean-Pierre Teunissen, Weert (NL); Margaretha Maria De Kok, Eindhoven (NL); Jeroen Van Den Brand, Goirle (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 757 days.

(21) Appl. No.: 17/927,513

(22) PCT Filed: Jun. 11, 2021

(86) PCT No.: PCT/NL2021/050372
§ 371 (c)(1),
(2) Date: Nov. 23, 2022

(87) PCT Pub. No.: WO2021/251829
PCT Pub. Date: Dec. 16, 2021

(65) Prior Publication Data

US 2023/0247862 A1 Aug. 3, 2023

(30) Foreign Application Priority Data

Jun. 12, 2020 (EP) .................................... 20179709

(51) Int. Cl.
*B29C 51/00* (2006.01)
*B29C 51/14* (2006.01)
(Continued)

(52) U.S. Cl.
CPC ............ *B29C 51/002* (2013.01); *B29C 51/14* (2013.01); *H10K 59/70* (2023.02); *H10K 59/80* (2023.02);
(Continued)

(58) Field of Classification Search
CPC ...... B29C 51/002; B29C 51/14; H10K 59/10; H10K 59/80; H10K 59/871; H10K 71/00;
(Continued)

(56) References Cited

U.S. PATENT DOCUMENTS

2003/0134488 A1* 7/2003 Yamazaki ............ H10H 29/142 438/455
2004/0238856 A1 12/2004 Makela et al.
(Continued)

FOREIGN PATENT DOCUMENTS

CN 107945672 A 4/2018
DE 102015101012 A1 7/2016
(Continued)

OTHER PUBLICATIONS

Translation of KR20140001010A, Im Sung Gap, "Adhesive Film and Method for Using Thereof" (Year: 2014).*
(Continued)

*Primary Examiner* — Jacob Y Choi
*Assistant Examiner* — Ashley Nicole Blackwell
(74) *Attorney, Agent, or Firm* — Leydig, Voit & Mayer, Ltd.

(57) ABSTRACT

A curved human interface device is manufactured by thermoforming a stack. The stack comprises a front substrate formed of a transparent, first thermoplastic material; an OLED display configured to display an image through the front substrate; and a thermomechanical buffer layer formed of a transparent, second thermoplastic material arranged between the front substrate and the OLED display. Heat is
(Continued)

applied to the stack for causing a temperature of the front substrate and buffer layer to increase to a respective processing temperature at which the first and second thermoplastic materials become pliable. The stack is thermoformed while the thermoplastic materials are pliable to form the curved human interface device. The second thermoplastic material has a lower stiffness at the respective processing temperature than the first thermoplastic material.

23 Claims, 6 Drawing Sheets

(51) Int. Cl.

| | |
|---|---|
| ***H10K 59/70*** | (2023.01) |
| ***H10K 59/80*** | (2023.01) |
| ***H10K 77/10*** | (2023.01) |
| *B29K 21/00* | (2006.01) |
| *B29K 33/00* | (2006.01) |
| *B29K 75/00* | (2006.01) |
| *B29L 31/34* | (2006.01) |
| *H10K 59/40* | (2023.01) |

(52) U.S. Cl.
CPC ........... *H10K 59/871* (2023.02); *H10K 77/10* (2023.02); *B29K 2021/003* (2013.01); *B29K 2033/12* (2013.01); *B29K 2075/00* (2013.01); *B29K 2995/0082* (2013.01); *B29L 2031/3475* (2013.01); *H10K 59/40* (2023.02)

(58) Field of Classification Search
CPC ........ H10K 77/10; H10K 59/40; H10K 59/70; H10K 77/111; B29K 2021/003; B29K 2033/12; B29K 2075/00; B29K 2995/0082; B29K 2995/0025; B29K 2995/0026; B29L 2031/3475
See application file for complete search history.

(56) References Cited

U.S. PATENT DOCUMENTS

| | | | | |
|---|---|---|---|---|
| 2012/0080671 | A1* | 4/2012 | Niboshi | H10K 59/8722 438/26 |
| 2014/0065389 | A1* | 3/2014 | Loy | H10D 86/0214 156/247 |
| 2016/0192474 | A1* | 6/2016 | Niskala | B29C 51/14 361/679.55 |
| 2018/0088631 | A1* | 3/2018 | Park | H04M 1/0269 |
| 2018/0279471 | A1* | 9/2018 | Chen | B32B 27/08 |
| 2019/0084214 | A1 | 3/2019 | Drexler et al. | |
| 2019/0107817 | A1 | 4/2019 | Gordon et al. | |
| 2021/0068281 | A1* | 3/2021 | Song | G02F 1/13394 |

FOREIGN PATENT DOCUMENTS

| | | | | | |
|---|---|---|---|---|---|
| DE | 102018009202 | A1 | * | 4/2019 | B29C 43/18 |
| EP | 3664586 | A1 | * | 6/2020 | H05K 3/0014 |
| JP | 2019511406 | A | | 4/2019 | |
| JP | 2019107817 | A | | 7/2019 | |
| JP | 2020112537 | A | | 7/2020 | |
| KR | 20140001010 | A | * | 6/2014 | H05B 33/04 |
| KR | 20140141142 | A | * | 12/2014 | G09F 9/301 |
| WO | 2020112537 | A1 | | 6/2020 | |

OTHER PUBLICATIONS

Translation of DE102018009202A1, Bastiaanse Marcel, "Method For Producing A 3D-shaped Display Glass, Device For Carrying Out Such A Method, And Display With Such A 3D-shaped Display Glass" (Year: 2019).*
Translation for Kim et al., KR-20140141142-A, "Curved Display and Fabricating Method Thereof" (Year: 2014).*
Weblink used to find information about PMMA (Year: 2025).*
Weblink used to find information about resin (Year: 2025).*
European Patent Office, International Search Report in corresponding International Application No. PCT/NL2021/050372, dated Sep. 23, 2021 (4 pages).
Japanese Patent Office, Notice of Allowance / Decision for a Patent in corresponding Japanese Patent Application No. 2022-576007 dated Jul. 29, 2025 (no translation available).

* cited by examiner

11D

18D

139D

THERMOFORMED DEVICE WITH OLED DISPLAY AND METHOD OF FABRICATION

CROSS-REFERENCE TO RELATED APPLICATIONS

This patent application is a U.S. National Phase of PCT International Application No. PCT/NL2021/050372, filed Jun. 11, 2021, which claims priority to European Application No. 20179709.9, filed Jun. 12, 2020, which are both expressly incorporated by reference in their entireties, including any references contained therein.

TECHNICAL FIELD AND BACKGROUND

The present disclosure relates to curved OLED devices and methods of manufacturing such devices.

A (human) interface device such as a touch panel may comprise various components such as a display device and optional sensor for human interaction with the device. While it is relatively common to manufacture a display screen on a flat substrate, adding curvature can be challenging. Curved (3D) substrates can be manufactured e.g. using processes such as thermoforming. Thermoforming typically involves deformation of a material (stack) at elevated temperature. For example, the substrate can be deformed according to a mold shape. An electronic circuit can be included in the stack to manufacture a curved device with functionality depending on electronic components in the circuit. For example, if an OLED display could be included in a thermoformed stack, various new applications would be enabled in the manufacturing of curved (human) interfaces. However, embedding certain functionalities such as OLED in a thermoformed/in-mold electronics has hitherto remained challenging e.g. due to the high temperature and strain involved in such processes. For example, reducing the temperature may be difficult due to material processing requirements, e.g. curing limitations. For example, strain can be reduced by using a smaller curvature or smaller OLED, but this limits applications. An additional problem that can occur, in particular for a mono-foil approach in in mold-electronics, is the occurrence of visual defects at the user end (front substrate) of the device. These defects can occur e.g. due to local deformations stemming from circuit lines, and particularly larger devices such as SMD chips and OLEDs, and the glue that is necessary to hold these SMD components in place while forming.

There is a need for the easy manufacturing of curved human interface devices, in particular to enable the inclusion of an OLED display during a thermoforming process.

SUMMARY

Aspects of the present disclosure relate to methods of manufacturing a curved device by thermoforming a stack including an OLED display. A front substrate is formed of a transparent, first thermoplastic material and a thermomechanical buffer layer is formed of a transparent, second thermoplastic material. The buffer layer is arranged between the front substrate and the OLED display. The stack is thermoformed into a three-dimensional (non-planar) shape to form the curved device. During or before thermoforming, heat is applied to the stack for causing a temperature of the front substrate and buffer layer to increase to a processing temperature. The materials of the front substrate and buffer layer are selected such that the second thermoplastic material has a lower stiffness (stress/strain) at the processing temperature than the first thermoplastic material.

The inventors surprisingly find that the insertion of such buffer layer can enable inclusion of an OLED display in the stack during a thermoforming process, wherein the OLED retains essential functionality whereas this would otherwise (without the buffer layer) cause fatal damage to the OLED. Without being bound by theory, the alleviation of damage can be partially explained by the lower stiffness of the buffer layer which may allow it to deform more than the front substrate and thus lower mechanical stresses to the OLED, which would otherwise transfer directly from the front substrate, and could, e.g., crack its moisture barrier. But even taking the lowered mechanical stress into account, it would be expected that the OLED can be damaged by thermal stress. However, the inventors actually find that the OLED can remain relatively cool while heat is applied to the stack. Even if the applied heat is carefully controlled, at least the front substrate and the buffer layer need to be heated for becoming pliable while being close or even contacting the OLED. Still the OLED need not be heated to the same temperature. This can be at least partially explained by the additional heat capacity of the buffer layer. As will be appreciated, heat capacity of a material undergoing phase transition can be relatively high, when the heat is utilized in changing the state of the material rather than raising its temperature. This is particularly the case when the thermoplastic material forming the buffer layer has a lower stiffness than that of the front substrate at the respective processing temperature. For example, the processing temperature at which the buffer layer undergoes phase transition can be lower than the processing temperature of the front substrate. So, by the synergetic combination of properties, the buffer layer can help to alleviate both thermal and mechanical stress on the OLED during the thermoforming process.

BRIEF DESCRIPTION OF DRAWINGS

These and other features, aspects, and advantages of the apparatus, systems and methods of the present disclosure will become better understood from the following description, appended claims, and accompanying drawing wherein:

FIG. 1A illustrates a planar (flat) stack including an OLED display and front substrate with a thermomechanical buffer layer there between;

DESCRIPTION OF EMBODIMENTS

Figure 1A:
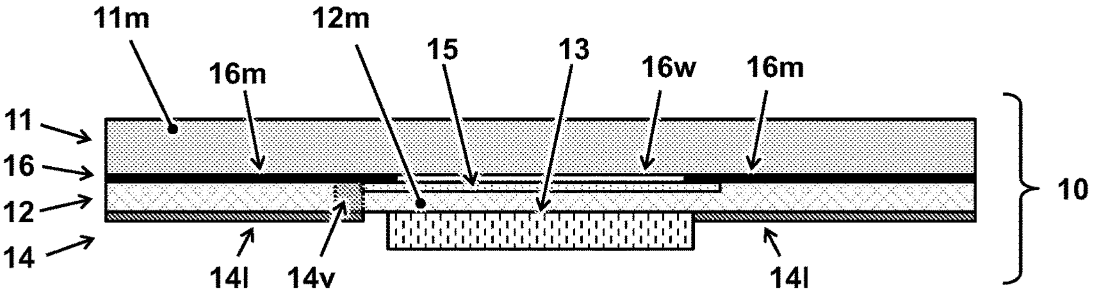

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1B:
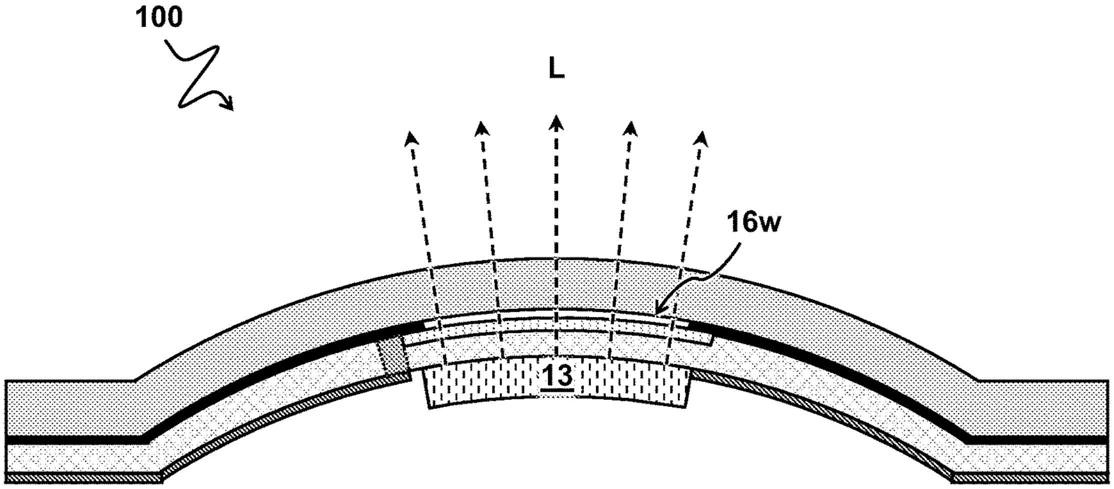
FIG. 1B illustrates a curved human interface device formed by thermoforming the stack.
Figure 2A:
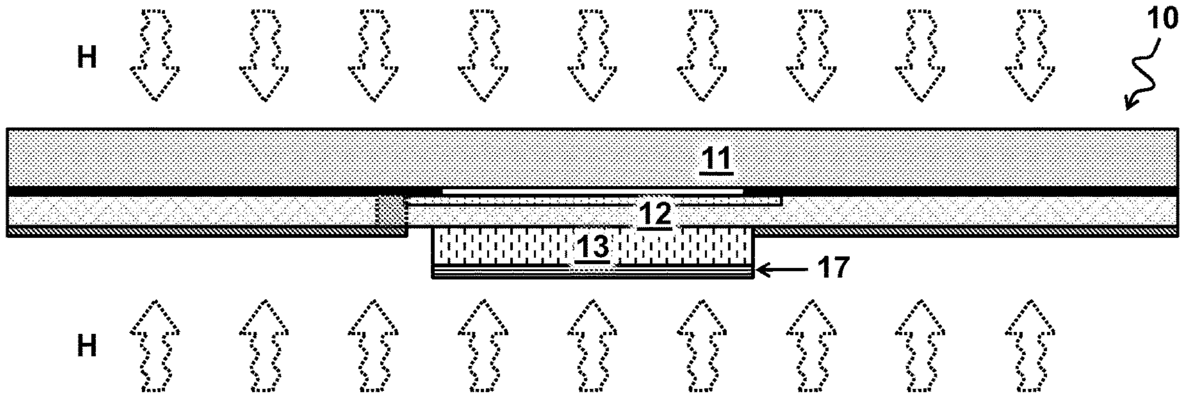
FIGS. 2A and 2B illustrate heating and thermoforming the stack using a mold shape.
Figure 2B:
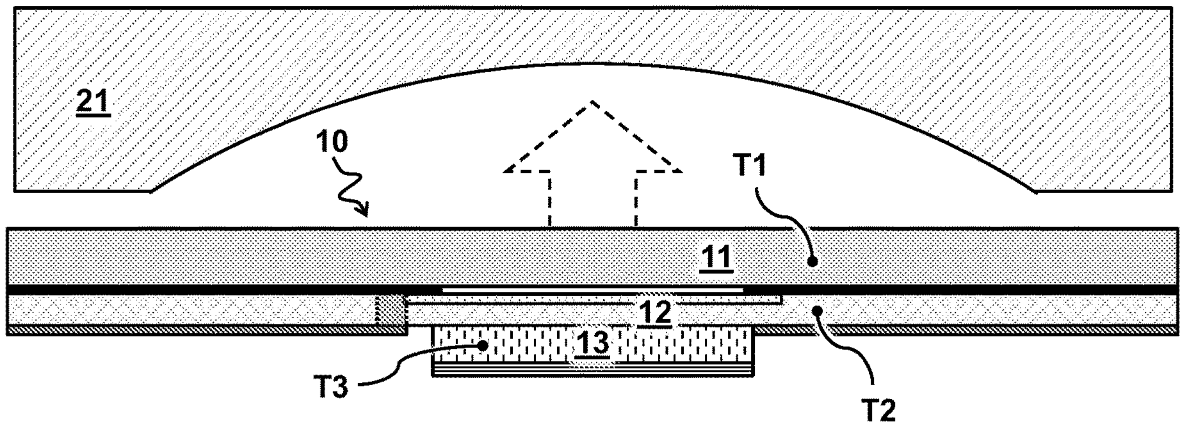
Figure 2C:
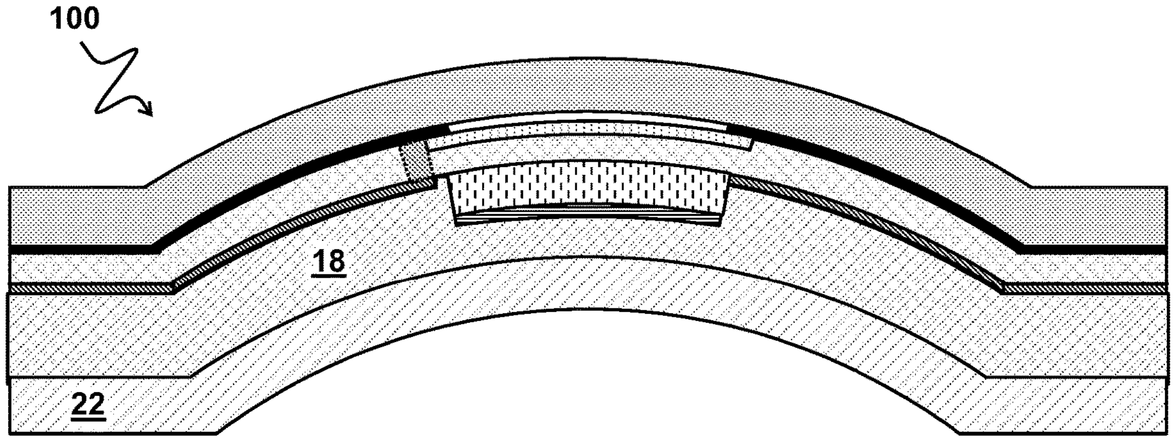
FIG. 2C illustrate application of a backing layer onto the stack by injection molding using another mold shape.

FIG. 1A illustrates a planar (flat) stack 10 including an OLED display 13 and front substrate 11 with a thermomechanical buffer layer 12 there between; FIG. 1B illustrates a curved human interface device 100 formed by thermoforming the stack 10; FIGS. 2A and 2B illustrate heating and thermoforming the stack; FIG. 2C illustrates application of an optional backing layer 18.

Some aspects of the present disclosure relate to the manufacturing of a curved device 100. For example, (out-of-plane) curvature can be introduced by applying a deformation process to a planar stack 10. Preferably, the deformation process comprises thermoforming. For example, the deformation process comprises applying a predefined macroscopic shape to the stack for thermoforming to the stack. Thermoforming is generally understood as a manufacturing process where a substrate of a thermoplastic (thermosoftening plastic) material is heated to a pliable forming temperature. Typically, above its glass transition temperature (Tg) and below its melting point, the physical properties of a thermoplastic change drastically without an associated phase change. The heated substrate can be formed to a specific shape e.g. using a mold, and trimmed to create a usable product. Typically, the stack is heated to a high-enough temperature that permits it to be stretched into or onto a mold 21, as shown in FIG. 2A, and cooled to a finished shape.

A particular preferred version of thermoforming is also known as High Pressure Forming. Another version of thermoforming is known as vacuum forming which however may require higher temperatures. For example, a machine can be used to heat the stack and stretch it over a mold using high pressure and/or vacuum. This method is typically used for sample and prototype parts. In other or further applications, production machines can be utilized to heat and form the substrate and optionally trim the formed parts from the stack in a continuous high-speed process. Alternatively, or in addition to thermoforming, also other deformation processes can be used for application of the present teachings such as injection molding, blow molding, rotational molding and other forms of processing plastics at elevated temperatures. So where reference herein is made to a thermoforming process or temperature, this may also be applicable to other similar processes. In some embodiments, e.g. as shown in FIG. 2C, a backing layer 18 is applied onto a back side of the stack by injection molding, e.g. using a mold 22. For example, a thermosetting material is melted and injected between the mold 22 and the stack.

In one embodiment, e.g. as shown e.g. in FIG. 1A, the stack 10 comprises a front substrate 11. For example, the front substrate comprises or essentially consists of a first thermoplastic material 11*m*, which is preferably transparent or at least translucent (to visible light). In a preferred embodiment, the stack comprises an OLED display 13 configured to display an image through the front substrate 11. Most preferably a thermomechanical buffer layer 12 is arranged between the front substrate 11 and the OLED display 13. For example, the buffer layer 12 comprises or essentially consists of a second thermoplastic material 12*m* which is preferably transparent or at least translucent.

In one embodiment, e.g. as shown e.g. in FIG. 2A, heat H is applied to the stack 10. This may cause a temperature of at least the front substrate 11 and buffer layer 12 to increase. Preferably the heat is applied so the front substrate and buffer layer reach a respective processing temperature T1,T2. At the respective processing temperature the first and second thermoplastic materials 11*m*,12*m* may become pliable (at least substantially more pliable than at room temperature 20° C.).

In one embodiment, e.g. as shown in FIG. 2B, the stack 10 is thermoformed, preferably while the thermoplastic materials 11*m*,12*m* are pliable to form the curved human interface device 100. While the figures show the heat H being applied before thermoforming, the heat can alternatively or additionally be applied during thermoforming.

As described herein, the second thermoplastic material 12*m* preferably has a lower stiffness at the respective processing temperature T1,T2 than the first thermoplastic material 11*m*. In other words, the second thermoplastic material 12*m* is more flexible or pliable, i.e. more easily deformed, than the first thermoplastic material 11*m*, at least during the thermoforming process. For example, the second thermoplastic material 12*m* can have a lower elastic and/or plastic modulus (e.g. lower by at least ten percent, preferably by at least twenty percent, or by at least fifty percent) than the first thermoplastic material 11*m* at the same or similar processing temperature T1,T2.

According to some aspects, the methods described herein can be used to manufacture a curved human interface device 100, e.g. as shown in FIG. 1B. In one embodiment, the device comprises a stack 10 with a front substrate 11 formed of a transparent, first thermoplastic material 11*m*; an OLED display 13 configured to display an image through the front substrate 11; and a thermomechanical buffer layer 12 formed of a transparent, second thermoplastic material 12*m* arranged between the front substrate 11 and the OLED display 13. Preferably, the curved human interface device 100 is formed by the thermoformed stack. For example, the front substrate 11 and buffer layer 12 are simultaneously thermoformable at a processing temperature T1,T2 at which the first and second thermoplastic materials 11*m*,12*m* become pliable. Most preferably, the second thermoplastic material 12*m* has a lower stiffness at the processing temperature T1,T2 than the first thermoplastic material 11*m*.

In some embodiments, the respective temperature T2 of the buffer layer 12 can remain lower than the temperature T1 of the front substrate 11 during the thermoforming. For example, the second thermoplastic material 12*m* has a lower glass transition temperature and/or melting temperature than the first thermoplastic material 11*m*, e.g. lower by at least five or ten degrees, preferably more. In this way, when applying heat, the energy can first be used to cause substantial phase change in the buffer layer 12 at a relative low temperature T2, whereas the front substrate 11 may reach a higher temperature T1 before substantial phase change occurs.

In some embodiments, the second thermoplastic material 12*m* may be softened or even (partially) melted while the first thermoplastic material 11*m* is less softened, at least not melted. So while the stack is deformed, a flow of the second thermoplastic material 12*m* can substantially buffer mechanical stresses between the front substrate 11 and OLED display 13, while the melting or other phase transition can also take up a substantial portion of heat energy.

In some embodiments, the OLED display 13 has a lower temperature T3 during the thermoforming than the front substrate 11, most preferably also lower than the buffer layer 12. Alternatively, or additionally, substrate temperature in the covered (by the second thermoplastic material and/or OLED) part of the device can be lower than in the non-covered section(s). In one embodiment, the stack has a lower temperature T3 during the thermoforming at an area of the OLED display 13 than at surrounding areas (not overlapping the OLED). For example, the temperature may be lower due to the effect of the buffer layer 12 and/or intrinsic properties of the OLED display. In some embodiments, the OLED can itself have a relatively high heat capacity, e.g. higher than the front substrate 11 and/or buffer layer 12. In other or further embodiments, wherein, at least during the application of heat H, the stack 10 is provided with a heat sink and/or heat shield 17 attached to the OLED display 13. For example, a heat sink can be attached to the OLED to draw heat from the OLED keeping it relatively cool. For example, a heat shield can be arranged to cover the OLED display 13 to shield the OLED from heat, e.g. applied by radiation or otherwise. As will be appreciated, the functions of the heat sink and heat shield can be combined in a single structure attached to cover the OLED, e.g. with a material such as metal having relatively high heat capacity and reflectance.

In some embodiments, the heat H is applied by radiation, preferably in an infrared wavelength range. For example, the stack 10 is heated by one or more IR lamps. In a preferred embodiment, the heat H is applied by radiation (at least) from a side of the front substrate 11 (i.e. from the top side in FIG. 2A). For example, the radiation can be exclusively applied to the front side to cause this side to be heated first while the opposite side (where the OLED is disposed) can remain relatively cooler. In other or further embodiments, as shown, the heat H is applied by radiation from both sides of the stack. For example, heating of the OLED can be alleviated by using a heat shield to block or reflect the radiation. This can also be achieved using a mask to irradiate the stack except at the location of the OLED. In some embodiments, heat is applied by radiation from a side of the OLED display 13, wherein a heat shield 17 or mask is arranged to block or reflect radiation from reaching the OLED display 13. While radiation is preferred, also other manners of applying heat to one or both sides of the stack can be envisaged, e.g. by contact or convection from one or both sides. This can also be done selectively, e.g. avoiding direct heating of the OLED.

In some embodiments, the respective processing temperature T1,T2 while thermoforming, preferably High Pressure Forming, the front substrate 11 and buffer layer 12 is (each) between 100-200° C., preferably less than 160° C., most preferably less than 140° C. or even less than 130° C., e.g. between one hundred thirty and one hundred sixty degrees Celsius (130-160° C.). During thermoforming a temperature of the OLED, is preferably lower than that of the front substrate 11 and/or buffer layer 12, e.g. lower by at least ten, twenty, or even thirty degrees Celsius. Preferably, the temperature of the OLED is kept below 110° C., most preferably below 105° C., or colder, at least below a temperature at which the OLED is critically damaged (losing essential functionality).

In a preferred embodiment, the first thermoplastic material 11*m* has a glass transition temperature below 160° C., preferably below 150° C., most preferably below 140° C., e.g. in a range between 100-130° C. In some embodiments, the second thermoplastic material 12*m* has a glass transition temperature lower than the first thermoplastic material 11*m*, e.g. at least five or ten degrees lower. Various combinations of thermoplastic materials can be used to form the front substrate 11 and/or buffer layer 12. In one embodiment, the front substrate 11 is made of polycarbonate (PC) which has a glass transition temperature of about 150° C. 423 K, so it softens gradually around this point and becomes deformable above about 155° C. 428 K. For example, when deforming PC, an ideal processing temperature is between 155-160° C. In another embodiment, the front substrate 11 is made of poly(methyl methacrylate) (PMMA). Typically, the glass transition temperature of PMMA is in range from 85 to 165° C. (depending on composition). Preferably PMMA is used with a processing temperature around 130° C. (and Tg below that). Also other materials can be used as the front substrate 11 such as ABS (acrylonitrile butadiene styrene), PETG (a thermoformable version of polyethylene terephthalate), PVC (polyvinyl chloride) et cetera. Of course the example temperatures may be different for other materials, although preferably not too high.

In some embodiments, the second thermoplastic material 12*m* comprises a thermoplastic elastomer. Thermoplastic elastomers (TPE), sometimes referred to as thermoplastic rubbers, are a class of copolymers or a physical mix of polymers (usually a plastic and a rubber) that consist of materials with both thermoplastic and elastomeric properties. For example, the second thermoplastic material 12*m* substantially softens when heated to temperatures which are substantially above room temperature, e.g. softening in a range between 80-140° C. In a preferred embodiment, the second thermoplastic material 12*m* comprises thermoplastic polyurethane (TPU) or Polyvinyl butyral (PVB). So for example a combination of PMMA and TPU can be thermoformed at a processing temperature around 130° C. while a combination of PC and TPU can be thermoformed at a processing temperature around 160° C.

In some embodiments, e.g. as shown in FIG. 1A, the stack 10 comprises an electric circuit 14 with circuit lines 141. Preferably, the circuit lines printed on the thermomechanical buffer layer 12. For example, the circuit lines 141 are printed using conductive ink, e.g. comprising silver (Ag). The circuit lines are preferably printed on the buffer layer 12 after it is laminated to the front substrate 11 but before thermoforming. Also other components are preferably applied between the lamination and thermoforming steps, although these processes can in principle also be applied to the buffer layer 12 before lamination. Typically, the circuit lines 141 are electrically connected to electronic components disposed on the buffer layer 12 including the OLED display 13. In addition to alleviating damage of sensitive components, such as the OLED, the buffer layer is also found to be useful in reducing visible defects which may occur as a result of thermoforming. For example, defects can be visible on the front substrate when relatively large and/or stiff components are included in the stack such as an OLED or other devices, e.g. SMDs, chips, et cetera. Alternatively, or in addition to printing circuit parts on the buffer layer 12, it can also be envisaged to print directly on the front substrate 11, although this may lead to visible artefacts depending on a size and composition of the printed parts, e.g. in relation to a thickness of the front substrate 11. If needed, these may be positioned at the edge of the device instead.

In some embodiments, the stack 10 comprises a sensor 15 arranged between the front substrate 11 and the buffer layer 12. For example, the stack can be thermoformed into a curved touch screen device or touch button. Preferably, the sensor 15 is configured as a proximity sensor, e.g. a capacitive sensor device capable of detecting a user interaction such as touching the front substrate 11. Most preferably, the proximity sensor 15 is substantially transparent to allow viewing of the OLED display 13 through the sensor. In some embodiments, components between the front substrate 11 and buffer layer 12, such as the sensor 15 shown in FIG. 1A, are electrically connected using via connection 14*v* through the buffer layer 12.

While it is preferably to place the proximity sensor 15 as close as possible to the front substrate 11, e.g. to better detect a touch event, in principle the proximity sensor 15 can also be placed elsewhere, e.g. between the buffer layer 12 and the OLED display 13, or behind the OLED display 13, and/or integrated as part of the OLED display 13. Alternatively, or in addition to a proximity sensor, also other types of sensors can be envisaged, e.g. a light sensor or a movement/motion sensor. For example, it can also be envisaged to detect movement of the whole device, or parts thereof, e.g. pressing of a (round) button with an OLED display formed by the present methods.

In some embodiments, the stack 10 comprises a graphical pattern 16 formed by one or more layers of opaque material 16*m*. Preferably, the graphical pattern 16 comprises at least one window 16*w* for emitted light L from an image displayed on the OLED display 13, or light emitted from or received by other components on the substrate, e.g. an LED or light sensor (not shown here). For example, the opaque material 16*m* may be used to hide circuit parts and other components disposed on the buffer layer 12, or between the buffer layer 12 and the graphical pattern 16. In some embodiments, the front substrate and/or buffer layer 12 are configured to function as a light guiding structure, e.g. cooperating with the graphical pattern which can also be white on side facing the buffer layer to reflect more light along the light guide. While the present figures show the graphical pattern 16 between the front substrate 11 and the buffer layer 12, which is preferred, it can also be envisaged to apply the graphical pattern or another pattern over the front substrate 11 (e.g. including an anti-scratch layer) or between the buffer layer 12 and the circuit, e.g. applying the graphical pattern 16 onto the buffer layer 12 before or after applying the circuit.

In some embodiments, the front substrate 11 has a thickness of one or two millimeter, preferably less, e.g. having a thickness between 250-700 μm. As will be appreciated, the present methods may allow a relatively thin front substrate 11 because visible artefacts from components behind the substrate can be alleviated by the buffer layer 12 there between. Advantageously, it is found that the buffer layer 12 can already be effective at relatively low thickness, e.g. at least five or ten micrometers, or more. In one embodiment, the buffer layer 12 is applied as a sheet, e.g. by laminating onto the front substrate 11 and/or OLED display 13. In another or further embodiment, the buffer layer 12 is printed, e.g. onto the front substrate 11 and/or OLED display 13. The inventors find in particular that a relatively thin buffer layer can be most reliably applied by printing, e.g. with thickness below twenty micrometer, below ten micrometer, down to five micrometer, or even less. The effectiveness of the buffer layer may generally increase with higher thickness, so preferably, the buffer layer 12 has a thickness between 20-1000 μm, more preferably between fifty and five hundred micrometer, or between 100-250 μm. As will be appreciated, even including the buffer layer, the total thickness of the front substrate 11 and buffer layer 12 can be lower than a conventional front substrate 11 without buffer layer 12, e.g. wherein the total thickness is less than two millimeter, less than one millimeter, or even less than half a millimeter. The thinner the total thickness, the closer the OLED display 13 may appear to the front surface of the device. The OLED is preferably as thin as possible. The surface area of the OLED may vary, e.g. between one square centimeter or more, e.g. up to tens of $cm^2$.

Figure 3A:
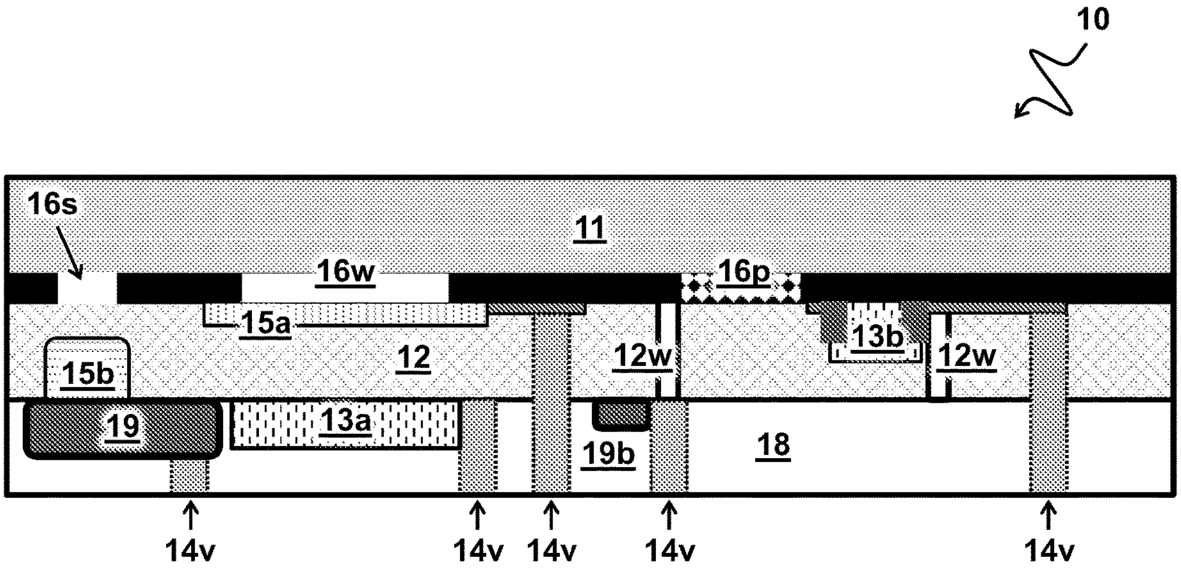
FIG. 3A illustrate a cross-section view of another stack layout.
Figure 3B:
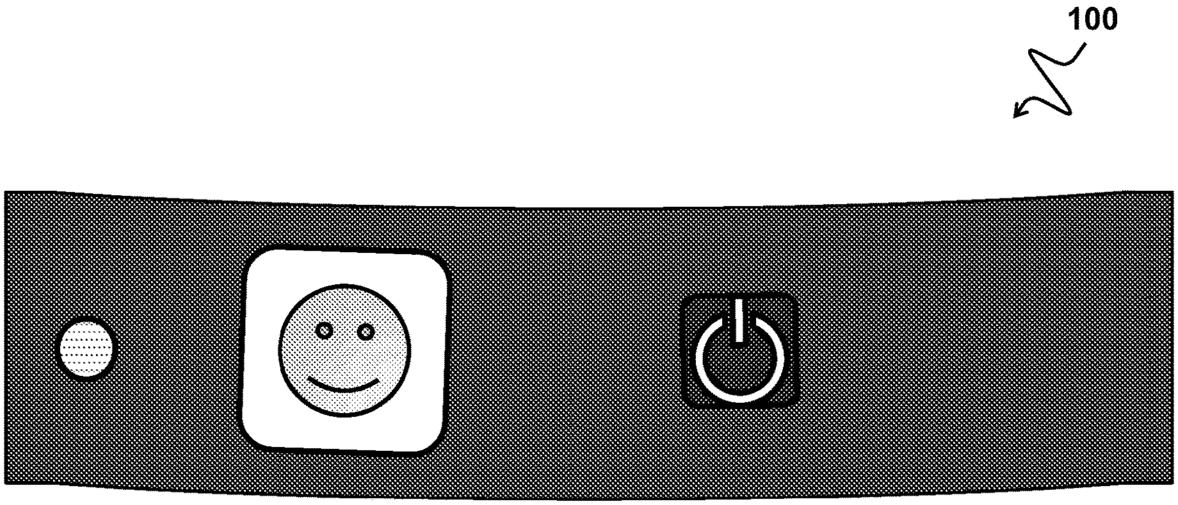
FIG. 3B illustrates a corresponding front surface of a curved human interface device which may result from thermoforming the stack.

FIG. 3A illustrate a cross-section view of another stack layout; FIG. 3B illustrates a corresponding front surface of a curved human interface device 100 which may result from thermoforming the stack 10. In some embodiments, the stack 10 comprise opto-electronic components such as an OLED display 13*a* and/or LED 13*b*. It will be appreciated that while the present teachings are particularly useful for the unexpected ability to integrate an OLED display in a thermoforming process, the teachings can also benefit integrating or other types of devices (display or not). Alternatively, or in addition to an OLED display, also other types displays, can be integrated in the stack, such as an electronic ink (E-ink) device/paper.

In some embodiments, the stack 10 comprises sensor components, such as a capacitive sensor 15*a* and/or other type of sensor 15*b*, e.g. light sensor, proximity sensor, time-of-flight sensor, motion sensor, et cetera. For some components it can be preferred to print these. Other components can be placed with other methods. In some embodiments, the stack 10 comprises a circuit board 19 (e.g. PCB), surface mounted component, integrated chip, FSR, et cetera. These and other components including the OLED may be connected to an electric circuit comprising circuit lines 141 (e.g. printed) on the buffer layer 12, on the front substrate 11, and/or via connections 14*v* through the buffer layer 12 and/or further layers such as an optional backing layer 18.

In some embodiments, the stack comprises light guiding structures. For example, light blocking walls 12*w* can be arranged to guide light from an LED 13*b* to a patterned light outlet, e.g. to form an indicator light as shown. In some embodiments, the backing layer 18 comprises a reflective, e.g. white material, which can help to guide light to a respective pattern 16*p* and/or window 16*w*. For example, this may be realized by vacuum or injection molding.

Typically, the components or devices to be integrated in the stack are relatively stiff, at least compared to the front substrate 11 and/or buffer layer 12. Also the manner in which the components are attached may contribute to the local stiffness. For example, components can be attached to the circuit lines using isotropic conductive adhesive (ICA). So the present methods may alleviate thermal and mechanical stresses on the OLED and/or other components.

Figure 4A:
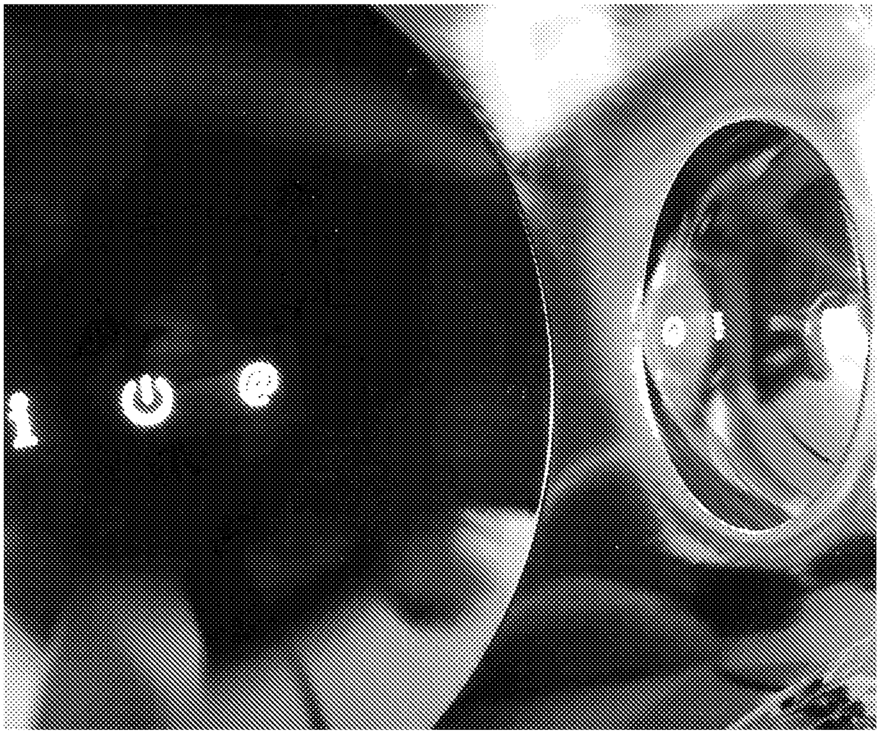
FIGS. 4A and 4B show photographs of a curved human interface device including an OLED display, as manufactured according to the present methods.
Figure 4B:
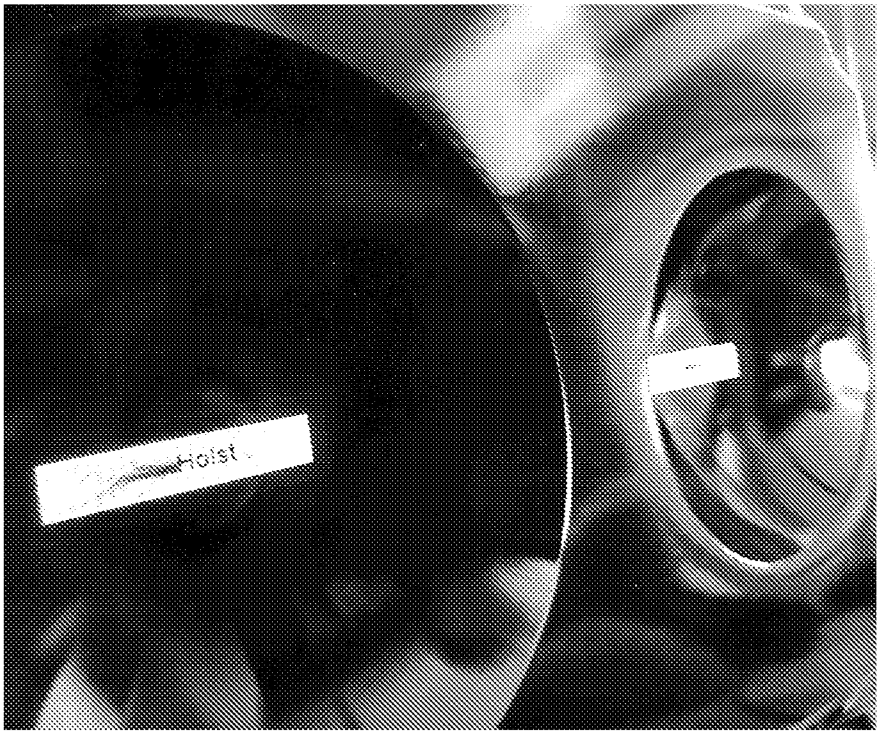

FIGS. 4A and 4B show photographs of a curved human interface device including an OLED display, as manufactured according to the present methods. As shown, different images can be displayed on the device, e.g. forming dynamic indicator lights and/or buttons.

Figure 5A:
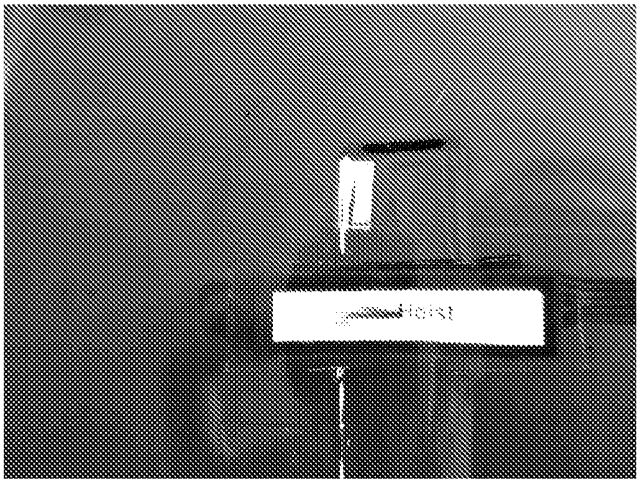
FIGS. 5A-5C show photographs of another such device with integrated OLED.
Figure 5B:
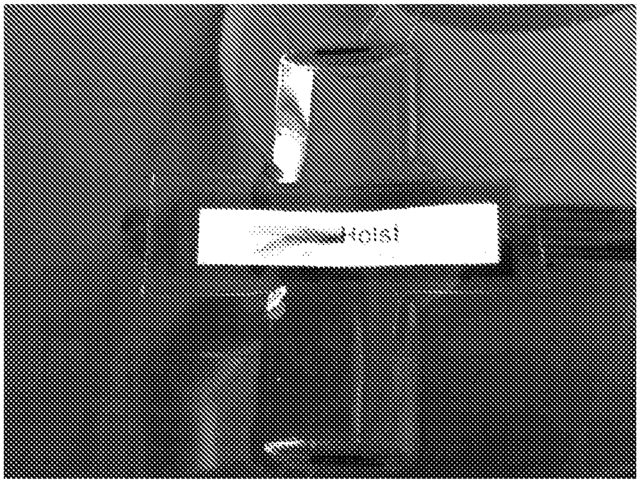
Figure 5C:
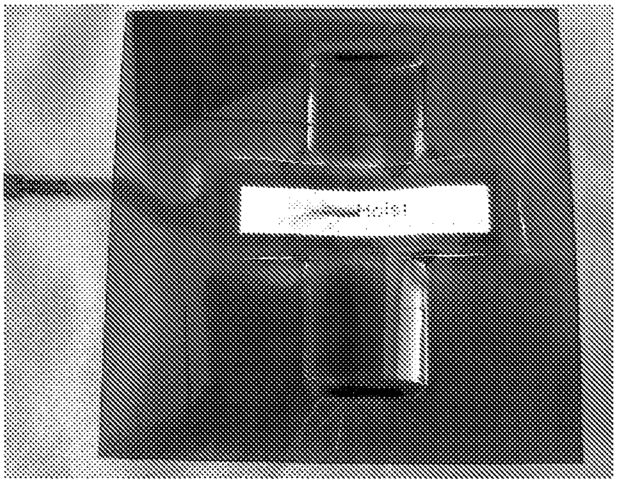

FIGS. 5A-5C illustrate an integrity test of another such device with integrated OLED. Here photographs are shown of the functioning device after 11 days, 18 days, and 139 days, since manufacturing. This demonstrates the reliability of products manufactured according to the present methods. In one embodiment, a curved human interface device as described herein is manufactured by applying a TPU buffer layer of 0.7 mm thickness onto a PMMA front substrate of 2 mm thickness. An OLED display was immediately applied to the TPU buffer layer. This stack was laminated at 90 degrees and later thermoformed at 130° C. The stack was formed using a positive half-cylinder mold as shown in the figures, in this case with only a local application of TPU, rather than full area (the latter is preferred).

Figure 6A:
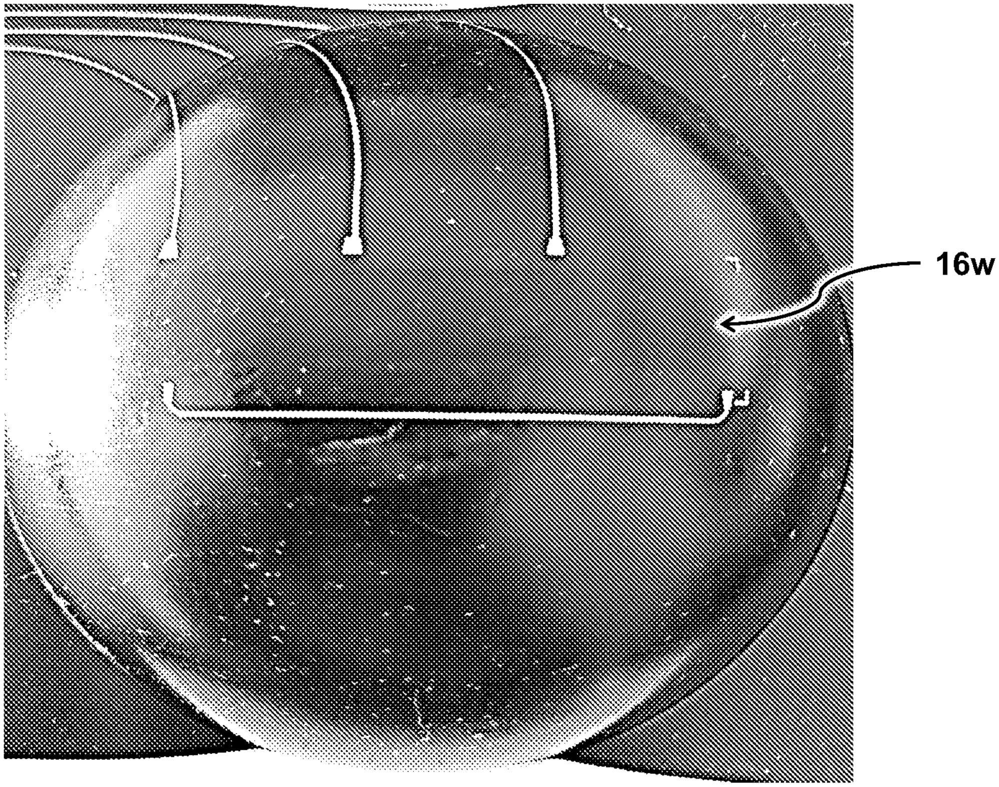
FIGS. 6A and 6B show a comparison between a stack which was thermoformed without and with OLED, respectively.
Figure 6B:
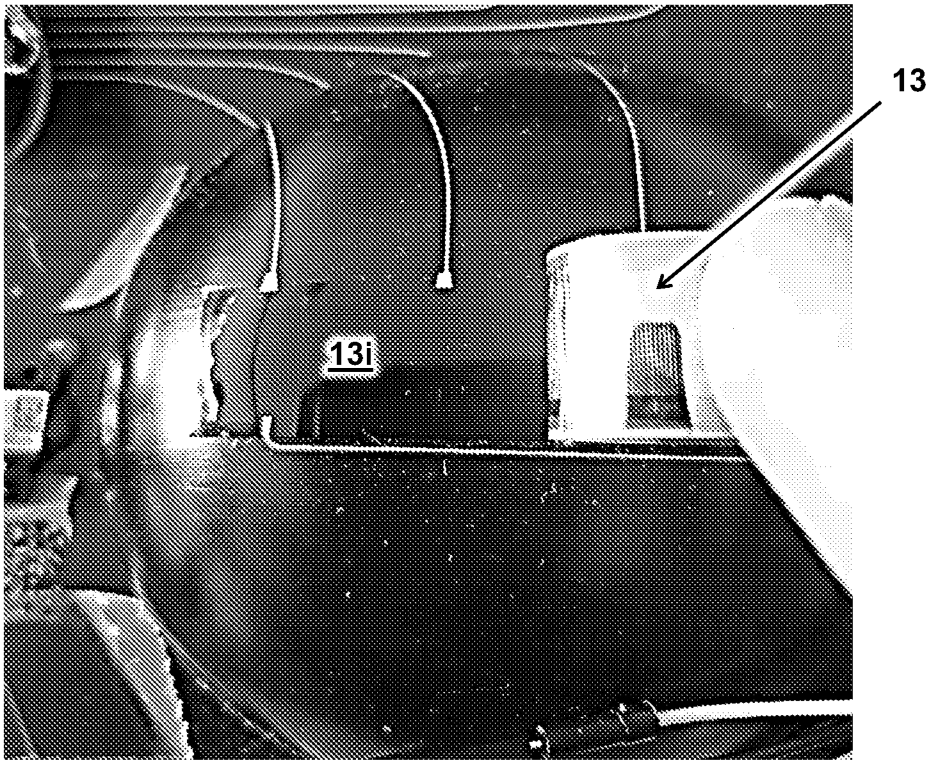

FIG. 6A shows a stack which was thermoformed without an OLED; FIG. 6B shows the same stack but thermoformed with an OLED display 13 that is being peeled off the stack after thermoforming—leaving an imprint 13*i*. As was earlier shown, e.g. with reference to FIGS. 2A-2C, the OLED display 13 is preferably an integral part of the stack while the thermoforming process is applied. So the buffer layer and/or front substrate may be at least partly melted and/or deformed by the heating and/or thermoforming process while the OLED display 13 is attached. This may leave an imprint 13*i*, e.g. an (at least superficial) indentation into the buffer layer according to a shape of the OLED display 13. For example, this can be seen as the relatively shiny imprint 13*i* in FIG. 6B that is absent in FIG. 6A (the rectangular dark area in FIG. 6A corresponds to a window 16*w* through the opaque layer beneath, not an imprint). In some embodiments, the imprint can be used to distinguish the curved human interface device, as described herein, from devices wherein the OLED display 13 is not part of the stack during thermoforming, and applied afterwards in a separate step. For example, devices formed according to the methods described herein may be recognized by a shape or roughness of the buffer layer and/or front substrate. For example, the shape of the buffer layer comprises an imprint 13*i*, e.g. indented shape or outline, of the OLED display 13 as a result of the OLED being present during thermoforming. For example, the imprint 13*i* may have different roughness (e.g. smoother) than a surrounding surface. For example, the OLED display 13 may be integrally connected to the buffer layer without further (adhesive) layer there between.

For the purpose of clarity and a concise description, features are described herein as part of the same or separate embodiments, however, it will be appreciated that the scope of the invention may include embodiments having combinations of all or some of the features described. For example, while embodiments were shown for embedding an OLED display device in a thermoformed stack, also alternative ways may be envisaged by those skilled in the art having the benefit of the present disclosure for achieving a similar function and result. For example, components and layers may be combined or split up into one or more alternatives. The various elements of the embodiments as discussed and shown offer certain advantages, such as preventing damage and alleviating visible artefacts. Of course, it is to be appreciated that any one of the above embodiments or processes may be combined with one or more other embodiments or processes to provide even further improvements in finding and matching designs and advantages. It is appreciated that this disclosure offers particular advantages to the manufacturing of curved human interface devices, and in general can be applied for any application wherein heat and/or strain sensitive components are included in a thermoforming process. For example, the present methods and systems may also be applied with other surface mounted devices in addition to, or alternative to, an OLED display device.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise.

The invention claimed is:

1. A method for manufacturing a curved human interface device, the method comprising:

providing a stack comprising:

a front substrate formed of a transparent, first thermoplastic material, an organic light-emitting diode (OLED) display configured to display an image through the front substrate, and a thermomechanical buffer layer formed of a transparent, second thermoplastic material arranged between the front substrate and the OLED display;

applying heat to the stack for causing a temperature of the front substrate and a temperature of the buffer layer to increase, respectively, to a first respective processing temperature at which the first thermoplastic material becomes pliable and to a second respective processing temperature at which the second thermoplastic material becomes pliable; and thermoforming the stack while the first thermoplastic material and the second thermoplastic material are pliable to form the curved human interface device;

wherein the second thermoplastic material has a stiffness at the second respective processing temperature that is lower than a stiffness of the first thermoplastic material at the first respective processing temperature.

2. The method according to claim 1, wherein the stack comprises a printed sensor arranged between the front substrate and the buffer layer.

3. The method according to claim 1, wherein the stack comprises an electric circuit with circuit lines printed on the thermomechanical buffer layer, and wherein the circuit lines are electrically connected to electronic components disposed on the buffer layer including the OLED display.

4. The method according to claim 1, wherein the stack comprises a graphical pattern formed by one or more layers of opaque material, wherein the graphical pattern comprises at least one window for transmitting light from an image displayed on the OLED display through the front substrate, and wherein the opaque material is arranged to block circuit parts or other components on the buffer layer from view through the front substrate.

5. The method according to claim 1, wherein, at least during the applying heat, the stack is provided with at least one component that is attached to the OLED display taken from the group consisting of:

a heat sink, and a heat shield.

6. The method according to claim 1, wherein, during the applying heat, the heat is applied by radiation from a side of the front substrate.

7. The method according to claim 1, wherein, during the applying heat, heat is applied by radiation from a side of the OLED display, wherein a heat shield or mask is arranged to block or reflect radiation from reaching the OLED display.

8. The method according to claim 1, wherein the OLED display has a lower temperature during the thermoforming than a temperature of the front substrate and a temperature of the buffer layer.

9. The method according to claim 1, wherein the first respective processing temperature and the second respective processing temperature are both between one hundred and one hundred sixty degrees Celsius, and wherein a temperature of the OLED display is kept below one hundred and ten degrees Celsius during the applying heat.

10. A curved human interface device comprising a thermoformed stack comprising:

a front substrate formed of a transparent, first thermoplastic material, an organic light-emitting diode (OLED) display configured to display an image through the front substrate, and a thermomechanical buffer layer formed of a transparent, second thermoplastic material arranged between the front substrate and the OLED display;

wherein the front substrate and buffer layer are simultaneously thermoformable at, respectively, a first respective processing temperature at which the first thermoplastic material becomes pliable and a second respective processing temperature at which the second thermoplastic material becomes pliable, wherein the second thermoplastic material has a stiffness at the second respective processing temperature that is lower than a stiffness of the first thermoplastic material at the first respective processing temperature, and wherein a shape of the buffer layer comprises an imprint formed by a shape of the OLED display being present during thermoforming.

11. The method according to claim 1, wherein the second thermoplastic material has a lower glass transition temperature or melting temperature than the first thermoplastic material.

12. The method according to claim 1, wherein the first thermoplastic material has a glass transition temperature in a range between 100-130 degrees Celsius.

13. The method according to claim 1, wherein the second thermoplastic material comprises a thermoplastic elastomer.

14. The method according to claim 1, wherein the front substrate has a thickness between 250-700 μm, and wherein the buffer layer has a thickness between 100-250 μm.

15. The method according to claim 1, wherein the front substrate comprises poly(methyl methacrylate) (PMMA), and wherein the buffer layer comprises thermoplastic polyurethane (TPU).

16. The curved human interface device according to claim 10, wherein the second thermoplastic material has a lower glass transition temperature or melting temperature than the first thermoplastic material.

17. The curved human interface device according to claim 10, wherein the first thermoplastic material has a glass transition temperature in a range between 100-130 degrees Celsius.

18. The curved human interface device according to claim 10, wherein the second thermoplastic material comprises a thermoplastic elastomer.

19. The curved human interface device according to claim 10, wherein the front substrate has a thickness between 250-700 μm, and wherein the buffer layer has a thickness between 100-250 μm.

20. The curved human interface device according to claim 10, wherein the front substrate comprises poly(methyl methacrylate) (PMMA), and wherein the buffer layer comprises thermoplastic polyurethane (TPU).

21. The method according to claim 1, wherein, after providing the stack comprising the thermomechanical buffer layer arranged between the front substrate and the OLED display, the applying the heat to said stack causes a temperature of said thermomechanical buffer layer within said stack to increase from an initial temperature to an elevated temperature at which the thermomechanical buffer layer itself becomes more pliable than at the initial temperature.

22. The method according to claim 1, wherein, during the thermoforming, the thermomechanical buffer layer deforms more readily than the front substrate and thereby accommodates shape differences between the front substrate and the OLED display.

23. The curved human interface device according to claim 10, wherein the second thermoplastic material is a thermosoftening plastic material having a glass transition temperature, and wherein, upon heating above the glass transition temperature to the second respective processing temperature, the second thermoplastic material becomes pliable.

* * * * *